(12) United States Patent
Kwon et al.

(10) Patent No.: US 9,812,448 B2
(45) Date of Patent: Nov. 7, 2017

(54) SEMICONDUCTOR DEVICES AND METHODS FOR FABRICATING THE SAME

(71) Applicants: Oh-Seong Kwon, Hwaseong-si (KR);
Jin-Kyu Jang, Hwaseong-si (KR);
Wan-Don Kim, Yongin-si (KR);
Hoon-Joo Na, Hwaseong-si (KR);
Sang-Jin Hyun, Suwon-si (KR)

(72) Inventors: Oh-Seong Kwon, Hwaseong-si (KR);
Jin-Kyu Jang, Hwaseong-si (KR);
Wan-Don Kim, Yongin-si (KR);
Hoon-Joo Na, Hwaseong-si (KR);
Sang-Jin Hyun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 4 days.

(21) Appl. No.: 14/963,271

(22) Filed: Dec. 9, 2015

(65) Prior Publication Data

US 2016/0181412 A1    Jun. 23, 2016

(30) Foreign Application Priority Data

Dec. 17, 2014   (KR) .......................... 10-2014-0182131
Oct. 26, 2015   (KR) .......................... 10-2015-0148870

(51) Int. Cl.
| | |
|---|---|
| *H01L 27/088* | (2006.01) |
| *H01L 21/28* | (2006.01) |
| *H01L 29/49* | (2006.01) |
| *H01L 29/66* | (2006.01) |
| *H01L 27/02* | (2006.01) |
| *H01L 27/11* | (2006.01) |
| *H01L 29/51* | (2006.01) |
| *H01L 29/78* | (2006.01) |

(Continued)

(52) U.S. Cl.
CPC ...... *H01L 27/088* (2013.01); *H01L 21/28088* (2013.01); *H01L 27/0207* (2013.01);
(Continued)

(58) Field of Classification Search
None
See application file for complete search history.

(56) References Cited

U.S. PATENT DOCUMENTS 4,725,566 A * 2/1988 Pham Ngu ........ H01L 21/28587
                                                    257/E21.452
5,615,073 A * 3/1997 Fried ................... H01L 27/0251
                                                    361/111

(Continued)

FOREIGN PATENT DOCUMENTS

JP       2005-109246        4/2005
KR   1020040059918 A        7/2004

(Continued)

*Primary Examiner* — Calvin Choi
(74) *Attorney, Agent, or Firm* — Myers Bigel, P.A.

(57) ABSTRACT

Provided are a semiconductor device configured to block a physical diffusion path by forming an oxide layer between barrier layers to prevent impurities from being diffused through the physical diffusion path between the barrier layers, and a method for fabricating the semiconductor device. The semiconductor device includes a gate insulation layer formed on a substrate, a first barrier layer formed on the gate insulation layer, an oxide layer formed on the first barrier layer, the oxide layer including an oxide formed by oxidizing a material included in the first barrier layer, a second barrier layer formed on the oxide layer, a gate electrode formed on the second barrier layer, and source/drains disposed at opposite sides of the gate electrode in the substrate.

19 Claims, 24 Drawing Sheets

(51) Int. Cl.
*H01L 29/165* (2006.01)
*H01L 21/8234* (2006.01)

(52) U.S. Cl.
CPC ...... *H01L 27/0886* (2013.01); *H01L 27/1104* (2013.01); *H01L 29/4966* (2013.01); *H01L 29/66545* (2013.01); *H01L 21/82345* (2013.01); *H01L 29/165* (2013.01); *H01L 29/517* (2013.01); *H01L 29/7848* (2013.01)

(56) References Cited

U.S. PATENT DOCUMENTS

| | | | |
|---|---|---|---|
| 2007/0202359 A1 | 8/2007 | Choi et al. | |
| 2012/0025323 A1* | 2/2012 | Teo | H01L 21/823425 257/384 |
| 2012/0119204 A1* | 5/2012 | Wong | H01L 21/823842 257/43 |
| 2012/0291861 A1 | 11/2012 | Mur et al. | |
| 2013/0171470 A1 | 7/2013 | Lee et al. | |
| 2015/0206977 A1* | 7/2015 | Katoh | H01L 29/41733 327/109 |

FOREIGN PATENT DOCUMENTS

| | | |
|---|---|---|
| KR | 1020040110930 A | 12/2004 |
| KR | 1020080029626 A | 4/2008 |
| KR | 1020100005999 A | 1/2010 |
| KR | 1020100011243 A | 2/2010 |
| WO | WO 2005-031762 | 9/2004 |

* cited by examiner

SEMICONDUCTOR DEVICES AND METHODS FOR FABRICATING THE SAME

CROSS-REFERENCE TO RELATED APPLICATION

This application claims priority from Korean Patent Application No. 10-2014-0182131 filed on Dec. 17, 2014 in the Korean Intellectual Property Office and Korean Patent Application No. 10-2015-0148870 filed on Oct. 26, 2015 in the Korean Intellectual Property Office, and all the benefits accruing therefrom under 35 U.S.C. 119, the contents of which in their entirety are herein incorporated by reference.

BACKGROUND

Recently, in order to improve characteristics of a semiconductor device, a metal gate, instead of a polysilicon gate, is often used. The metal gate may be formed using a replacement metal gate process.

Meanwhile, with a recent increasing trend in the integration density of semiconductor devices, sizes of memory cells have been gradually downscaled. In a downscaled semiconductor device, the replacement metal gate process may require multiple etching, depositing and polishing steps.

SUMMARY

Example embodiments of the present inventive concept provide semiconductor devices configured to block a physical diffusion path by forming an oxide layer between barrier layers to prevent impurities from being diffused through the physical diffusion path between the barrier layers.

Example embodiments of the present inventive concept also provide methods for fabricating a semiconductor device configured to block a physical diffusion path by forming an oxide layer between barrier layers to prevent impurities from being diffused through the physical diffusion path between the barrier layers.

According to example embodiments of the present inventive concept, there is provided a semiconductor device that includes a gate insulation layer on a substrate, a first barrier layer on the gate insulation layer, an oxide layer on the first barrier layer, the oxide layer comprising an oxide of a material included in the first barrier layer, a second barrier layer on the oxide layer, a gate electrode on the second barrier layer, and source/drains in the substrate and disposed at opposite sides of the gate electrode.

In some embodiments, the first barrier layer includes a conductive material. Some embodiments provide that the first barrier layer and the second barrier layer include the same material. In some embodiments, the first barrier layer includes titanium (Ti).

Some embodiments provide that the oxide layer is amorphous. In some embodiments, the oxide layer has a thickness of 20 Å or less. Some embodiments provide that the oxide layer includes TiO2.

Some embodiments include an interface layer that is between the substrate and the gate insulation layer.

Some embodiments of the present inventive concept are direct to a semiconductor device that includes a substrate having a first region and a second region defined therein, a first transistor in the first region, the first transistor including a first gate insulation layer a first barrier layer on the first gate insulation layer and first source/drains in the substrate, and a second transistor in the second region, the second transistor including a second gate insulation layer, a second barrier layer on the second gate insulation layer, an oxide layer on the second barrier layer, a third barrier layer on the oxide layer, a gate electrode on the third barrier layer and second source/drains in the substrate. Some embodiments provide that the first transistor does not include the gate electrode, the oxide layer includes an oxide of a material included in the second barrier layer, and the first transistor has a first channel length and the second transistor has a second channel length that is different from the first channel length.

In some embodiments, the second channel length is greater than the first channel length. Some embodiments provide that the first, second and third barrier layers include conductive materials. In some embodiments, the first, second and third barrier layers include the same material. Some embodiments provide that the first, second and third barrier layers include titanium (Ti).

In some embodiments, the oxide layer is amorphous. Some embodiments provide that the oxide layer has a thickness of 20 Å or less. In some embodiments, the oxide layer includes TiO2.

Some embodiments include a first interface layer that is between the substrate and the first gate insulation layer and a second interface layer that is between the substrate and the second gate insulation layer.

Some embodiments of the present inventive concept are directed to a semiconductor device that includes an active fin that extends in a first direction on a substrate, the active fin protruding from a substrate, a gate insulation layer that extends in a second direction intersecting the first direction on the active fin, a first barrier layer that is on the gate insulation layer, an oxide layer that is on the first barrier layer, the oxide layer comprising an oxide of a material included in the first barrier layer, a second barrier layer that is on the oxide layer, a gate electrode that is on the second barrier layer, and source/drains in the substrate and disposed at opposite sides of the gate electrode in the active fin.

In some embodiments, the first and second barrier layers include conductive materials. Some embodiments provide that the first and second barrier layers include the same material. In some embodiments, the first and second barrier layers include titanium (Ti).

In some embodiments, the oxide layer is amorphous. Some embodiments provide that the oxide layer has a thickness of 20 Å or less. Some embodiments provide that the oxide layer includes TiO2.

Some embodiments of the present inventive concept are directed to methods for fabricating a semiconductor device. Such methods may include forming an interlayer dielectric layer including a trench on a substrate, forming a gate insulation layer on an inner surface of the trench, forming a first barrier layer on the gate insulation layer, forming an oxide layer on the first barrier layer by exposing the first barrier layer to an oxygen environment, forming a second barrier layer on the oxide layer, the second barrier including a same material as the first barrier layer, and forming a gate electrode on the second barrier layer.

In some embodiments, the forming of the first barrier layer, the forming of the oxide layer, and the forming of the second barrier layer are performed in-situ.

Some embodiments provide that the oxide layer has a thickness of 20 Å or less.

In some embodiments, the first and second barrier layers include conductive materials. Some embodiments provide that the first and second barrier layers include titanium (Ti).

In some embodiments, before the forming of the gate insulation layer, further comprising forming an interface layer on a bottom surface of the trench.

Some embodiments of the present inventive concept are directed to a semiconductor device that includes a substrate including a first region and a second region defined therein, a first transistor that is on an active portion of the first region, the first transistor including a first gate insulation layer, a first barrier layer that is on the first gate insulation layer, a first gate spacer that is on a lateral surface of the first gate insulation layer, and first source/drains in the active portion of the first region, and a second transistor that is on an active portion of the second region, the second transistor including a second gate insulation layer, a second barrier layer that is on the second gate insulation layer, an oxide layer that is on the second barrier layer, a third barrier layer that is on the oxide layer, a gate electrode that is on the third barrier layer a second gate spacer that is on a lateral surface of the second gate insulation layer and second source/drains in the active portion of the second region. In some embodiments, the oxide layer comprises an oxide of a material that is included in the second barrier layer and the first transistor has a first channel length and the second transistor has a second channel length different from the first channel length.

In some embodiments, the first gate spacer and the second gate spacer comprise a same material. Some embodiments provide that the first gate spacer and the second gate spacer comprise SiN and/or SiON. In some embodiments, the first transistor does not include the gate electrode. Some embodiments provide that the second channel length is greater than the first channel length. In some embodiments, the first and second barrier layers include a same material that includes conductive materials. In some embodiments, the oxide layer includes TiO2. Some embodiments include a first interface layer that is between the substrate and the first gate insulation layer and a second interface layer that is between the substrate and the second gate insulation layer.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The above and other features and advantages of the present inventive concept will become more apparent by describing in detail preferred embodiments thereof with reference to the attached drawings in which.

DETAILED DESCRIPTION

Figure 1:
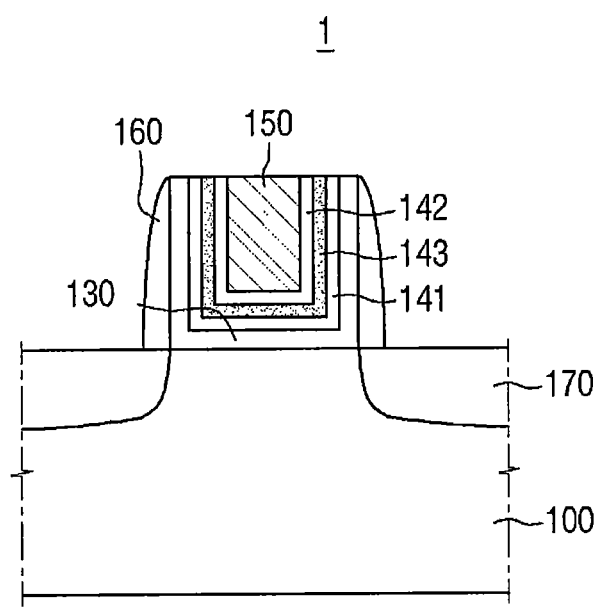
FIG. 1 is a cross-sectional view of a semiconductor device according to example embodiments of the present inventive concept.

The present inventive concept will now be described more fully hereinafter with reference to the accompanying drawings, in which some example embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or example terms provided herein is intended merely to better illuminate the invention and is not a limitation on the scope of the invention unless otherwise specified. Further, unless defined otherwise, all terms defined in generally used dictionaries may not be overly interpreted.

The present inventive concept will be described with reference to perspective views, cross-sectional views, and/or plan views, in which some embodiments of the invention are shown. Thus, the profile of an example view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Hereinafter, a semiconductor device according to example embodiments of the present inventive concept will be described with reference to FIG. 1.

FIG. 1 is a cross-sectional view of a semiconductor device according to example embodiments of the present inventive concept. Referring to FIG. 1, the semiconductor device 1 according to example embodiments of the present inventive concept may include a substrate 100, a first gate insulation layer 130, a first barrier layer 141, a first oxide layer 143, a second barrier layer 142, a first gate electrode 150, a first gate spacer 160, and a first source/drain region 170.

The substrate 100 may be a rigid substrate, such as a silicon substrate, a silicon on insulator (SOI) substrate, a gallium arsenide substrate, a silicon germanium, a ceramic substrate, a quartz substrate or a glass substrate for display, and/or a flexible plastic substrate, such as a substrate made of polyimide, polyester, polycarbonate, polyethersulfone, polymethylmethacrylate, polyethylene naphthalate and/or polyethyleneterephthalate. In some embodiments, the substrate 100 may be of a first conductivity type, for example, P type, but aspects of the present inventive concept are not limited thereto.

The first gate insulation layer 130 may be formed on the substrate 100 and may include a high-k material. The first gate insulation layer 130 may include, for example, HfSiON, $HfO_2$, $ZrO_2$, $Ta_2O_5$, $TiO_2$, $SrTiO_3$, $BaTiO_3$, and/or $SrTiO_3$. In some embodiments, the first gate insulation layer 130 may be conformally formed along sidewalls of the first gate spacer 160.

Meanwhile, the first gate insulation layer 130 may be formed to have an appropriate thickness according to the kind of a device to be formed. For example, when the first gate insulation layer 130 includes $HfO_2$, it may be formed to have a thickness of about 50 Å or less (in a range of about 5 Å to about 50 Å), but aspects of the present inventive concept are not limited thereto.

The first barrier layer 141 is formed on the first gate insulation layer 130. The first barrier layer 141 may include a conductive material, for example, TiN. The first barrier layer 141 may be formed to have an appropriate thickness according to the kind of a device to be formed. For example, the first barrier layer 141 may be formed to have a thickness in a range of about 5 Å to about 25 Å.

The first barrier layer 141 and the second barrier layer 142 to be described later may function as adhesion layers between the first gate electrode 150 and the first gate insulation layer 130. The first barrier layer 141 may be conformally formed along the first gate insulation layer 130 using, for example, chemical vapor deposition (CVD) and/or atomic layer deposition (ALD).

The first oxide layer 143 may be formed on the first barrier layer 141. In particular, the first oxide layer 143 may be formed between the first barrier layer 141 and the second barrier layer 142, thereby preventing fluorine (F) ions generated from tungsten hexafluoride ($WF_6$) included in the first gate electrode 150 from penetrating into the first gate insulation layer 130.

In some embodiments of the present inventive concept, the first oxide layer 143 may be formed using natural oxidation by exposing the first barrier layer 141 to an oxygen environment. The first barrier layer 141 and the second barrier layer 142 to be described later may be formed in a crystallized state, so that they may provide a physical movement path to fluorine (F) ions. In order to prevent fluorine (F) ions from being diffused, the first oxide layer 143 is formed. In order to block a physical diffusion path of the fluorine (F) ions, the first barrier layer 141 and the second barrier layer 142 may be entirely converted into amorphous states. To this end, it may be necessary to dope heterogeneous materials having high crystallization temperatures into the first barrier layer 141 and the second barrier layer 142, which may, however, increase specific resistance of the first barrier layer 141 and the second barrier layer 142, thereby lowering the reliability of the semiconductor device.

In addition, in order to block a physical diffusion path of the fluorine (F) ions, heterogeneous materials, which are different from the first barrier layer 141 and the second barrier layer 142, may be deposited between the first barrier layer 141 and the second barrier layer 142, which may, however, increase wire resistance. Therefore, in the present inventive concept, the first oxide layer 143 as a natural oxide layer is formed between the first barrier layer 141 and the second barrier layer 142 so as to block the physical diffusion path of the fluorine (F) ions without an additional process and an increased specific resistance.

The first oxide layer 143 may include an oxide (e.g., $TiO_2$) of a material (e.g., Ti) included in the first barrier layer 141 and may be formed to have a thickness of, for example, 20 Å or less. The first oxide layer 143 may be amorphous so as to function to block a physical diffusion path of the fluorine (F) ions.

The second barrier layer 142 is formed on the first oxide layer 143. The second barrier layer 142 may include the same material as the first barrier layer 141. The second barrier layer 142 may include a conductive material, for example, TiN. The second barrier layer 142 may be formed to have an appropriate thickness according to the kind of a device to be formed. For example, the second barrier layer 142 may be formed to have a thickness in a range of about 5 Å to about 25 Å.

The first barrier layer 141 and the second barrier layer 142 may function as adhesion layers between the first gate electrode 150 and the first gate insulation layer 130.

The second barrier layer 142 may be conformally formed along sidewalls of the first oxide layer 143 using, for example, chemical vapor deposition (CVD) or atomic layer deposition (ALD).

The first barrier layer 141, the first oxide layer 143 and the second barrier layer 142 may be formed using an ex-situ process. That is to say, in the course of forming the first barrier layer 141 and the second barrier layer 142, the first oxide layer 143 may be formed on the first barrier layer 141 by exposing the first barrier layer 141 to an oxygen environment, and the second barrier layer 142 may then be formed. That is to say, the first oxide layer 143 may be formed using natural oxidation.

In addition, the first barrier layer 141, the first oxide layer 143 and the second barrier layer 142 may be formed using an in-situ process. In the course of forming the first barrier layer 141 and the second barrier layer 142, the first oxide layer 143 may be formed on the first barrier layer 141 by injecting oxygen atoms.

The first gate electrode 150 is formed on the second barrier layer 142. The first gate electrode 150 may include a conductive material, for example, tungsten (W) or aluminum (Al), but aspects of the present inventive concept are not limited thereto.

The first gate spacer 160 may be formed on lateral surfaces of the first gate insulation layer 130. The first gate spacer 160 may include, for example, at least one of SiN and SiON.

The first source/drain region 170 may be disposed at opposite sides of the first gate electrode 150 in the substrate 100. The first source/drain region 170 may be an n-type source/drain region doped with n-type impurity. The first source/drain region 170 may have a lightly doped drain (LDD) structure, but aspects of the present inventive concept are not limited thereto. The structure of the first source/drain region 170 may vary according to the kind of a device to be formed.

Hereinafter, a semiconductor device according to example embodiments of the present inventive concept will be described with reference to FIG. 2.

Figure 2:
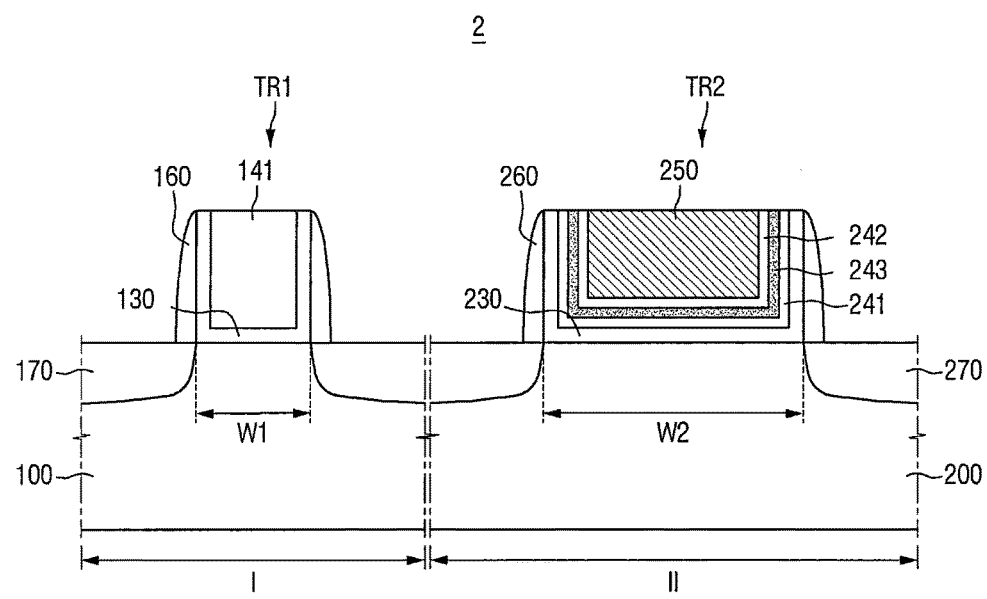
FIG. 2 is a cross-sectional view of a semiconductor device according to example embodiments of the present inventive concept.

FIG. 2 is a cross-sectional view of a semiconductor device according to example embodiments of the present inventive concept.

However, for the sake of brevity, substantially the same elements and features as those of the semiconductor device 1 according to the example embodiments of FIG. 1 will be omitted.

Referring to FIG. 2, the semiconductor device 2 according to the example embodiments of the present inventive concept may include substrates 100 and 200, a first gate insulation layer 130, a first barrier layer 141, a first gate spacer 160, a first source/drain region 170, a second gate insulation layer 230, a third barrier layer 241, a second oxide layer 243, a fourth barrier layer 242, a second gate electrode 250, a second gate spacer 260, and a second source/drain region 270.

The substrates 100 and 200 may include a first region I and a second region II. The first region I and the second region II may be divided by a field insulation layer, such as a shallow trench isolation (STI). The first region I may be a region where a channel length of a first transistor TR1 is a first distance W1, and the second region II may be a region where a channel length of a second transistor TR2 is a second distance W2. Here, the first distance W1 and the second distance W2 may be different from each other. For example, the second distance W2 may be greater than the first distance W1. Here, the channel length may be defined as a distance between adjacent source/drain regions of each of the first and second transistors TR1 and TR2.

The substrate 100 may be defined to mean the first region I and the substrate 200 may be defined to mean the second region II. In general, a semiconductor device may be fabricated to have a short channel and a long channel according to characteristics of the semiconductor device, and the first region I may mean a short channel region and the second region II may mean a long channel region. Here, a gate electrode may not be formed in the first transistor TR1 formed in the first region I, unlike in the second transistor TR2 formed in the second region II. Since the first barrier layer 141 includes a conductive material, the first transistor TR1 formed in the first region I may function as a transistor even if it may not include a gate electrode. For example, come embodiments provide that the first barrier layer 141 may act like a gate electrode. An oxide layer may be formed in the second transistor TR2 formed in the second region II. That is to say, the second oxide layer 243 may prevent fluorine (F) ions generated from tungsten hexafluoride ($WF_6$) included in the second gate electrode 250 from penetrating into the second gate insulation layer 230.

The first transistor TR1 may include the substrate 100, the first gate insulation layer 130, the first barrier layer 141, the first gate spacer 160, and the first source/drain region 170, which have been described above, respectively. However, the first barrier layer 141 may have a thickness that is greater than that of the third barrier layer 241. The first barrier layer 141 may fill a space defined by the first gate insulating layer 130. In some embodiments, the first barrier layer 141 may have an entirely flat top surface.

The second transistor TR2 may include the substrate 200, the second gate insulation layer 230, the third barrier layer 241, the second oxide layer 243, the fourth barrier layer 242, the second gate electrode 250, the second gate spacer 260, and the second source/drain region 270. The third barrier layer 241, the second oxide layer 243, and the fourth barrier layer 242 may have a concave shape, respectively The substrate 200, the second gate insulation layer 230, the third barrier layer 241, the second oxide layer 243, the fourth barrier layer 242, the second gate electrode 250, the second gate spacer 260, and the second source/drain region 270 are substantially the same as the substrate 100, the first gate insulation layer 130, the first barrier layer 141, the first oxide layer 143, the second barrier layer 142, the first gate electrode 150, the first gate spacer 160, and the first source/drain region 170, which have been described above, respectively.

Figure 3:
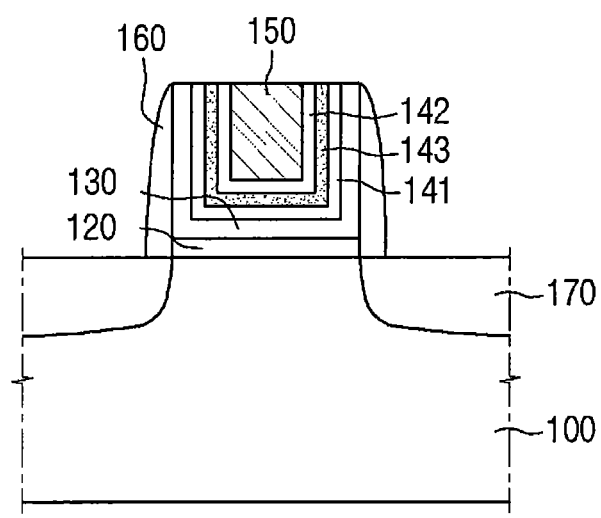
FIG. 3 is a cross-sectional view of a semiconductor device according to example embodiments of the present inventive concept.

FIG. 3 is a cross-sectional view of a semiconductor device according to example embodiments of the present inventive concept.

However, for the sake of brevity, substantially the same elements and features as those of the semiconductor device 1 according to the example embodiments of FIG. 1 will be omitted.

Referring to FIG. 3, the semiconductor device 3 according to the example embodiments of the present inventive concept may include a substrate 100, a first interface layer 120, a first gate insulation layer 130, a first barrier layer 141, a first oxide layer 143, a second barrier layer 142, a first gate electrode 150, a first gate spacer 160, and a first source/drain region 170.

The substrate 100, the first gate insulation layer 130, the first barrier layer 141, the first oxide layer 143, the second barrier layer 142, the first gate electrode 150, the first gate spacer 160, and the first source/drain region 170 are substantially the same as the corresponding elements, which have been described above, respectively.

The first interface layer 120 may be formed on the substrate 100 and may be formed between the substrate 100 and the first gate insulation layer 130.

The first interface layer 120 may prevent interface failure between the substrate 100 and the first gate insulation layer 130. The first interface layer 120 may include a low-k dielectric material having a dielectric constant (k) of 9 or less, for example, a silicon oxide layer (k=4) or a silicon oxynitride layer (k=4~8 according to the concentration of oxygen and nitrogen atoms). In some embodiments, the first interface layer 120 may include silicate or a combination of layers listed above.

Figure 4:
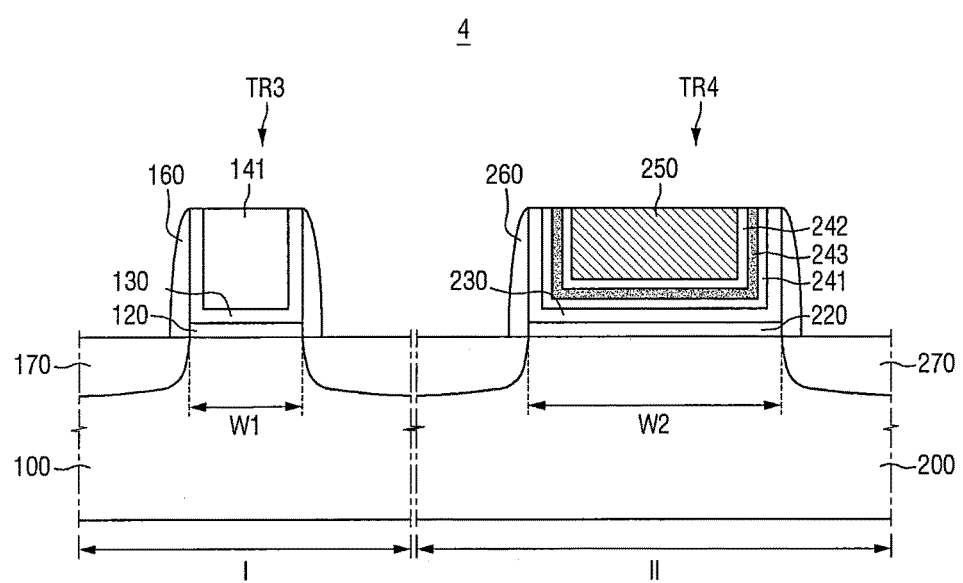
FIG. 4 is a cross-sectional view of a semiconductor device according to example embodiments of the present inventive concept.

FIG. 4 is a cross-sectional view of a semiconductor device according to example embodiments of the present inventive concept.

However, for the sake of brevity, substantially the same elements and features as those of the semiconductor devices 1 to 3 according to the example embodiments of FIGS. 1 to 3 will be omitted.

Referring to FIG. 4, the semiconductor device 4 according to the example embodiments of the present inventive concept may include substrates 100 and 200, a first interface layer 120, a first gate insulation layer 130, a first barrier layer 141, a first gate spacer 160, a first source/drain region 170, a second interface layer 220, a second gate insulation layer 230, a third barrier layer 241, a second oxide layer 243, a fourth barrier layer 242, a second gate electrode 250, a second gate spacer 260, and a second source/drain region 270.

The second interface layer 220 is substantially the same as the above-described first interface layer 120, and the other components may also be substantially the same as those of the semiconductor device 4, which have been described above, respectively.

Hereinafter, semiconductor devices according to other embodiments of the present inventive concept will be described with regard to fin type semiconductor devices.

Figure 5:
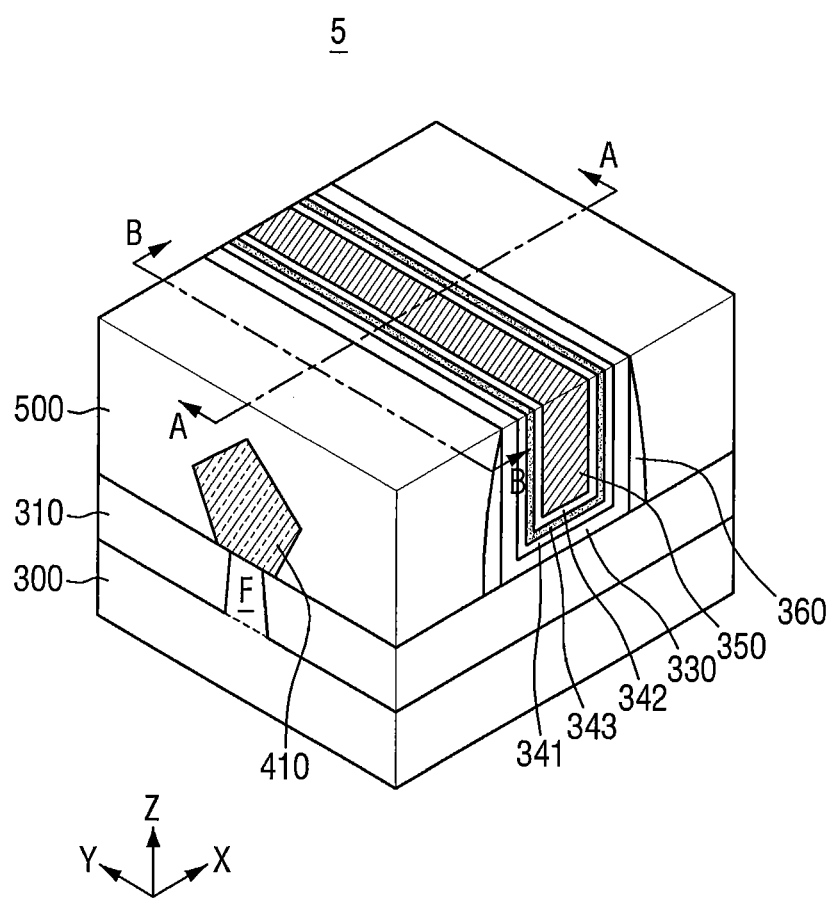
FIG. 5 is a cross-sectional view of a semiconductor device according to example embodiments of the present inventive concept.
Figure 6:
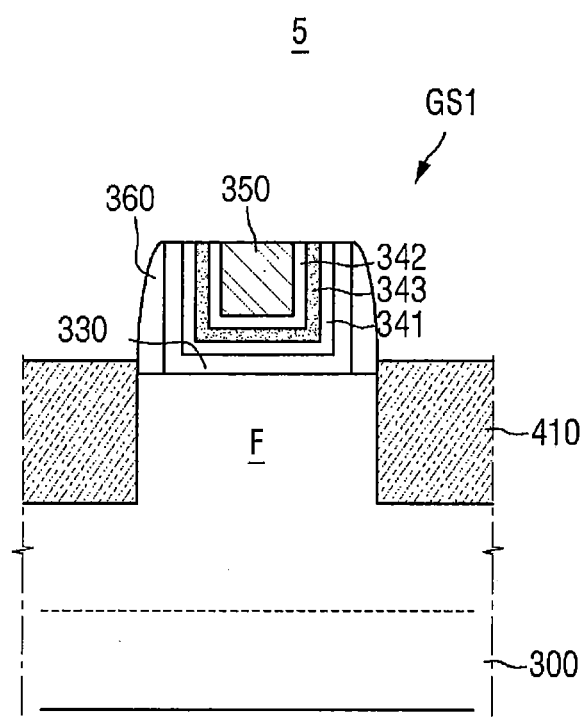
FIG. 6 is a cross-sectional view taken along the line A-A of FIG. 5.
Figure 7:
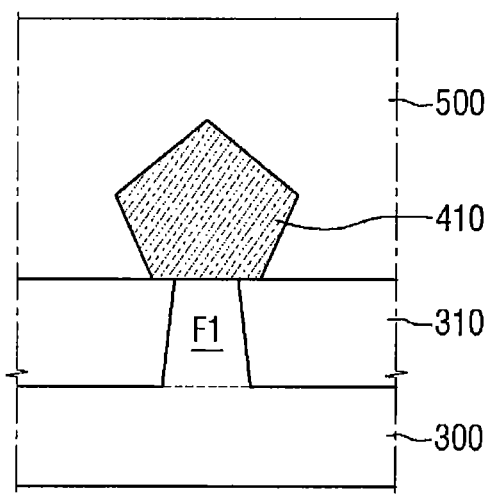
FIG. 7 is a cross-sectional view taken along the line B-B of FIG. 5.

FIG. 5 is a cross-sectional view of a semiconductor device according to example embodiments of the present inventive concept, FIG. 6 is a cross-sectional view taken along the line A-A of FIG. 5 and FIG. 7 is a cross-sectional view taken along the line B-B of FIG. 5.

Referring to FIGS. 5 to 7, the semiconductor device 5 according to the example embodiments of the present inventive concept may include a substrate 300, a first field insulation layer 310, an active fin F, a third gate insulation layer 330, a fifth barrier layer 341, a third oxide layer 343, a sixth barrier layer 342, a third gate electrode 350, a third gate spacer 360, a third source/drain region 410, and a first interlayer dielectric layer 500.

The substrate 300 may be a rigid substrate, such as a silicon substrate, a silicon on insulator (SOI) substrate, a gallium arsenide substrate, a silicon germanium, a ceramic substrate, a quartz substrate or a glass substrate for display, or a flexible plastic substrate, such as a substrate made of polyimide, polyester, polycarbonate, polyethersulfone, polymethylmethacrylate, polyethylene naphthalate and/or polyethyleneterephthalate.

The first field insulation layer 310 is formed on the substrate 300 and is used for device isolation. The first field insulation layer 310 is an insulation layer, such as a high density plasma (HDP) oxide layer, a spin-on-glass (SOG) oxide layer, and/or a chemical vapor deposition (CVD) oxide layer, but aspects of the present inventive concept are not limited thereto.

The active fin F is formed on the substrate 300. In particular, the active fin F may be formed to protrude on the substrate 300. In particular, the active fin F may protrude on the substrate 300 in a third direction Z. The active fin F may be a portion of the substrate 300 and may include an epitaxial layer grown from the substrate 300. The active fin F may extend lengthwise in a first direction X. The first field insulation layer 310 may cover a top surface of the substrate 300 and portions of lateral surfaces of the active fin F.

A first gate structure GS1 may be formed on the active fin F in a direction crossing the active fin F. The first gate structure GS1 may extend lengthwise in a second direction Y.

The first gate structure GS1 may include a third gate insulation layer 330, a fifth barrier layer 341, a third oxide layer 343, a sixth barrier layer 342, a third gate electrode 350 and a third gate spacer 360 formed on lateral surfaces of the third gate insulating layer 330, which are sequentially formed on the active fin F. With this configuration, channels may be formed on opposite lateral surfaces and a top surface of the active fin F.

The third gate insulation layer 330 may be formed on the active fin F. However, an interface layer may further be formed between the third gate insulation layer 330 and the active fin F. The third gate insulation layer 330 may be conformally formed along sidewalls of the third gate spacer 360. For example, the third gate insulation layer 330 may be disposed between the fifth barrier layer 341 and the third gate spacer 360.

The third gate insulation layer 330 may include a high-k material. In detail, the third gate insulation layer 330 may include, for example, HfSiON, $HfO_2$, $ZrO_2$, $Ta_2O_5$, $TiO_2$, $SrTiO_3$, $BaTiO_3$, and/or $SrTiO_3$.

Meanwhile, the third gate insulation layer 330 may be formed to have an appropriate thickness according to the kind of a device to be formed. For example, when the third gate insulation layer 330 includes $HfO_2$, it may be formed to have a thickness of about 50 Å or less (in a range of about 5 Å to about 50 Å), but aspects of the present inventive concept are not limited thereto.

The fifth barrier layer 341 may be formed on the third gate insulation layer 330. The fifth barrier layer 341 may be formed to make contact with the third gate insulation layer 330. According to some embodiments of the present inventive concept, as shown in FIG. 5, the fifth barrier layer 341 may upwardly extend along sidewalls of the third gate insulating layer 330.

The fifth barrier layer 341 may include a conductive material, for example, TiN. The fifth barrier layer 341 may be formed to have an appropriate thickness according to the kind of a device to be formed. For example, the fifth barrier layer 341 may be formed to have a thickness in a range of about 5 Å to about 25 Å.

The fifth barrier layer 341 and the sixth barrier layer 342 to be described later may function as adhesion layers between the third gate electrode 350 and the third gate insulation layer 330. The fifth barrier layer 341 may be conformally formed along sidewalls of the third gate insulation layer 330 using, for example, chemical vapor deposition (CVD) or atomic layer deposition (ALD).

The third oxide layer 343 may be formed on the fifth barrier layer 341. In particular, the third oxide layer 343 is formed between the fifth barrier layer 341 and the sixth barrier layer 342, thereby preventing fluorine (F) ions generated from tungsten hexafluoride ($WF_6$) included in the third gate electrode 350 from penetrating into the third gate insulation layer 330.

In some embodiments of the present inventive concept, the third oxide layer 343 may be formed using natural oxidation by exposing the fifth barrier layer 341 to an oxygen environment. The fifth barrier layer 341 and the sixth barrier layer 342 to be described later may be formed in a crystallized state, so that they may provide a physical movement path to fluorine (F) ions. In order to prevent fluorine (F) ions from being diffused, the third oxide layer 343 is formed.

The third oxide layer 343 may include an oxide (e.g., $TiO_2$) of a material (e.g., Ti) included in the fifth barrier layer 341 and may be formed to have a thickness of, for example, 20 Å or less. The third oxide layer 343 may be amorphous so as to function to block a physical diffusion path of the fluorine (F) ions.

The sixth barrier layer 342 is formed on the third oxide layer 343. The sixth barrier layer 342 may include the same material as the fifth barrier layer 341. The sixth barrier layer 342 may include a conductive material, for example, TiN. The sixth barrier layer 342 may be formed to have an appropriate thickness according to the kind of a device to be formed. For example, the sixth barrier layer 342 may be formed to have a thickness in a range of about 5 Å to about 25 Å.

The sixth barrier layer 342 may be conformally formed along sidewalls of the third oxide layer 343 using, for example, chemical vapor deposition (CVD) or atomic layer deposition (ALD).

The third gate electrode 350 is formed on the sixth barrier layer 342. The third gate electrode 350 may include a conductive material, for example, tungsten (W) or aluminum (Al), but aspects of the present inventive concept are not limited thereto.

The third gate spacer 360 may be formed on at least one of lateral surfaces of the first gate structure GS1. The third gate spacer 360 may include at least one of a nitride layer, an oxynitride layer, and/or a low-k dielectric material layer.

In addition, the third gate spacer 360 having a curved lateral surface is illustrated, but aspects of the present inventive concept are not limited thereto. However, the shape of the third gate spacer 360 may vary. For example, the third gate spacer 360 may have an I-letter shape or an L-letter shape, unlike in the illustrated embodiment.

Further, the third gate spacer 360 formed of a single layer is illustrated herein, but aspects of the present inventive concept are not limited thereto. The third gate spacer 360 may be formed of multiple layers.

Meanwhile, the third source/drain region 410 may be formed at at least one of opposite sides of the first gate structure GS1 to be formed in the active fin F. The third source/drain region 410 and the first gate structure GS1 may be electrically insulated from each other by the third gate spacer 360.

When the semiconductor device 5 is an NMOS transistor, the third source/drain region 410 may include the same material as the substrate 300 or a tensile stress material. For example, when the substrate 300 includes Si, the third source/drain region 410 may include Si and/or a material having a smaller lattice constant than Si (e.g., SiC or SiP). The tensile stress material may be applied to the active fin F under the first gate structure GS1, that is, a channel region, thereby improving carrier mobility of the channel region.

Meanwhile, when the semiconductor device 5 is a PMOS transistor, the third source/drain region 410 may include a compressive stress material. For example, the compressive stress material may be a material having a greater lattice constant than Si (e.g., SiGe). The compressive stress material may be applied to the active fin F under the first gate structure GS1, that is, a channel region, thereby improving carrier mobility of the channel region.

In some embodiments of the present inventive concept, the third source/drain region 410 may be formed by epitaxial growth, but aspects of the present inventive concept are not limited thereto.

The first interlayer dielectric layer 500 may include a low-k dielectric material. For example, the first interlayer dielectric layer 500 may include at least one of an oxide layer, a nitride layer and an oxynitride layer. The low-k dielectric material may include, for example, flowable oxide (FOX), tonen silazene (TOSZ), undoped silica glass (USG), borosilica glass (BSG), phosphosilaca glass (PSG), borophosphosilica glass (BPSG), plasma enhanced tetra ethyl ortho silicate (PE-TEOS), fluoride silicate glass (FSG), high density plasma (HDP) oxde, plasma enhanced oxide (PEOX), flowable CVD (FCVD) oxide, and/or combinations thereof, but aspects of the present inventive concept are not limited thereto.

Figure 8:
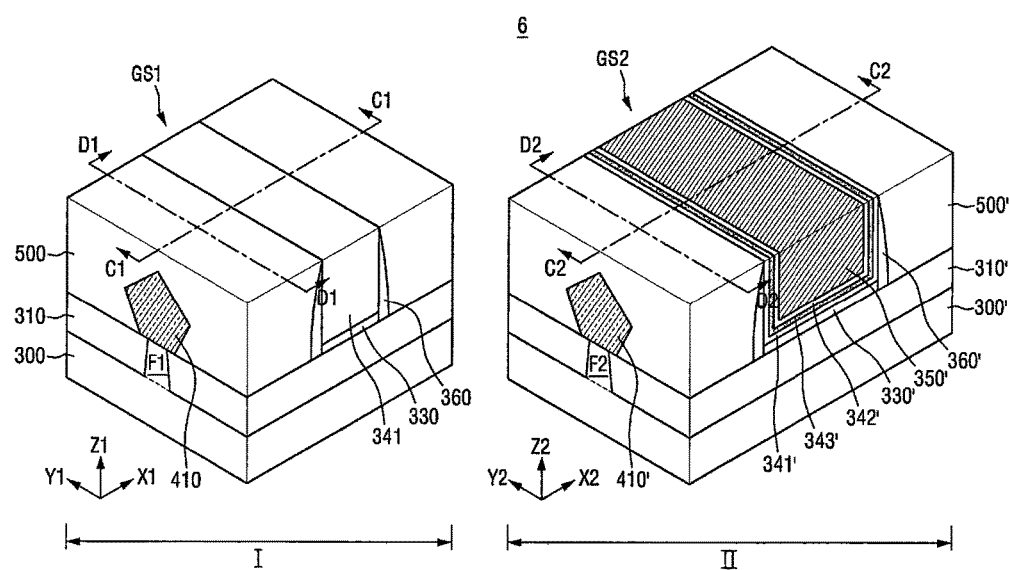
FIG. 8 is a perspective view of a semiconductor device according to example embodiments of the present inventive concept.
Figure 9:
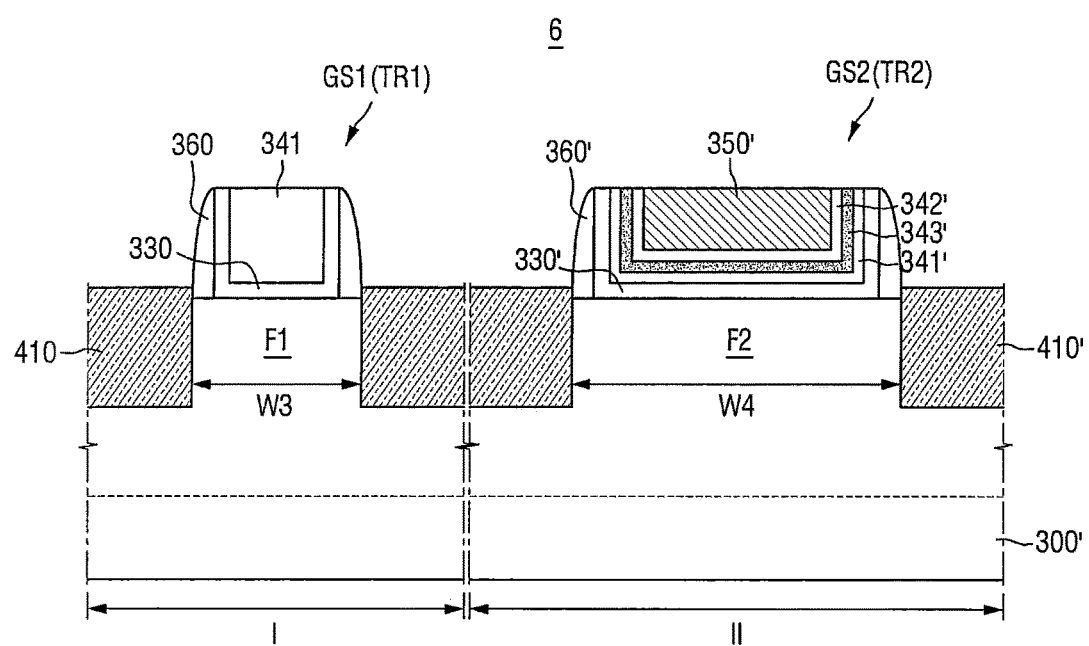
FIG. 9 is a cross-sectional view taken along lines C1-C1 and C2-C2 of FIG. 8.
Figure 10:
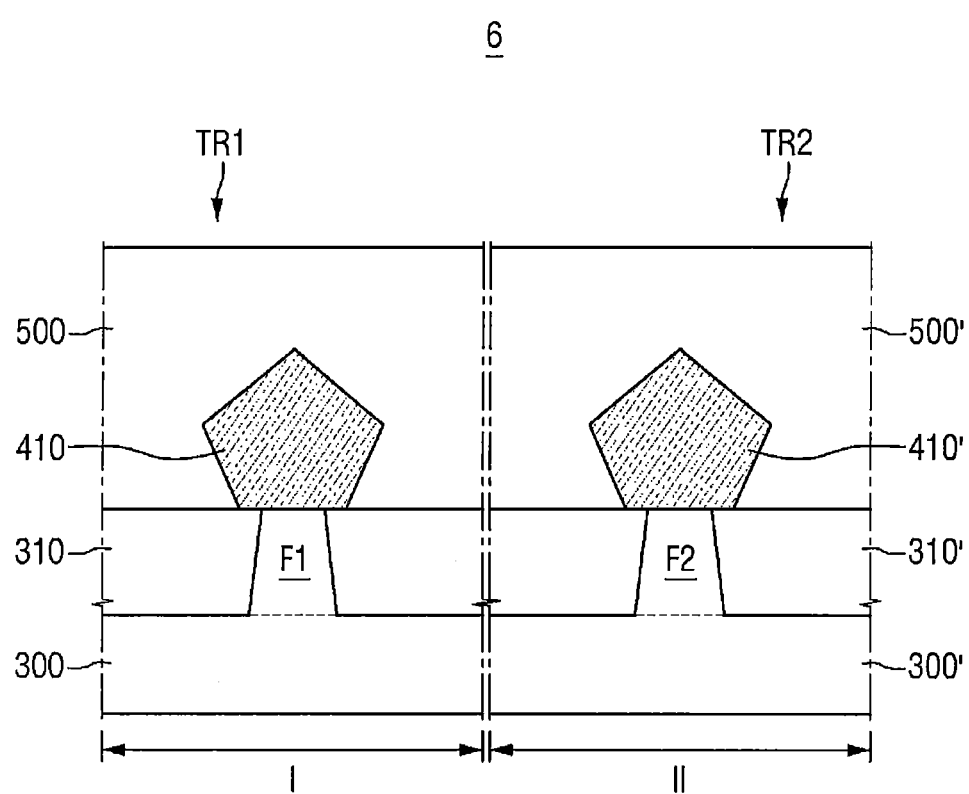
FIG. 10 is a cross-sectional view taken along lines D1-D1 and D2-D2 of FIG. 8.

FIG. 8 is a perspective view of a semiconductor device according to example embodiments of the present inventive concept, FIG. 9 is a cross-sectional view taken along lines C1-C1 and C2-C2 of FIG. 8 and FIG. 10 is a cross-sectional view taken along lines D1-D1 and D2-D2 of FIG. 8.

However, for the sake of brevity, substantially the same elements and features as those of the semiconductor device 5 according to the example embodiments of FIGS. 5 to 7 will be omitted.

Referring to FIGS. 8 to 10, the semiconductor device 6 according to the example embodiments of the present inventive concept may include substrates 300 and 300', a first field insulation layer 310, a first active fin F1, a third gate insulation layer 330, a fifth barrier layer 341, a third gate spacer 360, a third source/drain region 410, a first interlayer dielectric layer 500, a second field insulation layer 310', a second active fin F2, a fourth gate insulation layer 330', a seventh barrier layer 341', a fourth oxide layer 343', an eighth barrier layer 342', a fourth gate electrode 350', a fourth gate spacer 360', a fourth source/drain region 410', and a second interlayer dielectric layer 500'.

In the semiconductor device 6, the substrate 300 and 300' may include a first region I and a second region II. The first region I and the second region II may be divided by a field insulation layer, such as a shallow trench isolation (STI). The first region I may be a region where a channel length of a first transistor including the first gate structure GS1 is a third distance W3, and the second region II may be a region where a channel length of a second transistor including the second gate structure GS2 is a fourth distance W4. Here, the third distance W3 and the fourth distance W4 are different from each other. For example, the fourth distance W4 may be greater than the third distance W3. Here, the channel length may be defined as a distance between adjacent source/drain regions of each of the first and second transistors TR1 and TR2.

The substrate 300, the first field insulation layer 310, the first active fin F1, the third gate insulation layer 330, the fifth barrier layer 341, the third gate spacer 360, the third source/drain region 410, and the first interlayer dielectric layer 500 are substantially the same as the corresponding elements, which have been described above, respectively. However, the fifth barrier layer 341 may have a thickness greater than that of the seventh barrier layer 341'. The fifth barrier layer 341 may fill a space defined by the third gate insulating layer 330. The fifth barrier layer 341 may have a flat top surface.

In addition, the substrate 300', the second field insulation layer 310', the second active fin F2, the fourth gate insulation layer 330', the seventh barrier layer 341', the fourth oxide layer 343', the eighth barrier layer 342', the fourth gate electrode 350', the fourth gate spacer 360', the fourth source/drain region 410', and the second interlayer dielectric layer 500' are substantially the same as the substrate 300, the first field insulation layer 310, the active fin F, the third gate insulation layer 330, the fifth barrier layer 341, the third oxide layer 343, the sixth barrier layer 342, the third gate electrode 350, the third gate spacer 360, the third source/drain region 410, and the first interlayer dielectric layer 500, which have been described above, respectively. In some embodiments, the seventh barrier layer 341', the fourth oxide layer 343', the eighth barrier layer 342' may have a concave shape, respectively, FIGS. 11 to 13 are a circuit view and layout views of a semiconductor device according to example embodiments of the present inventive concept.

Figure 11:
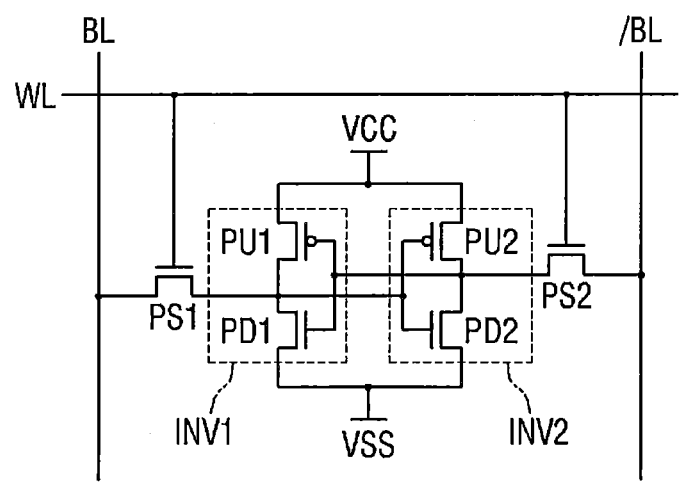
FIGS. 11 to 13 are a circuit view and layout views of a semiconductor device according to example embodiments of the present inventive concept.
Figure 12:
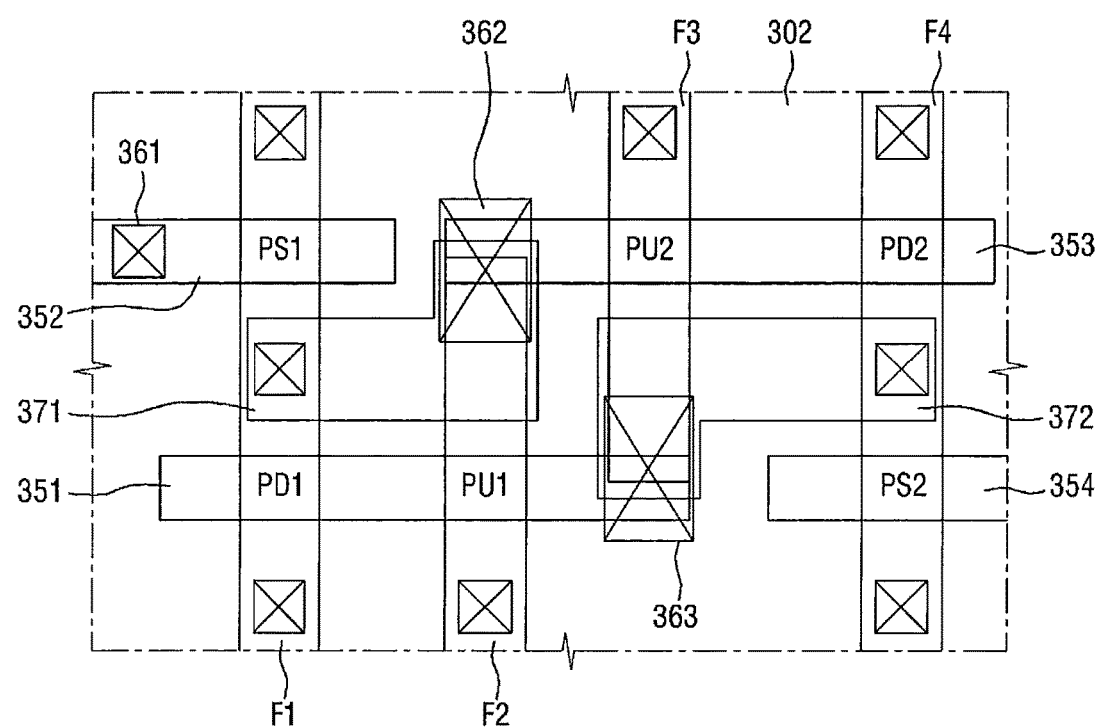
Figure 13:
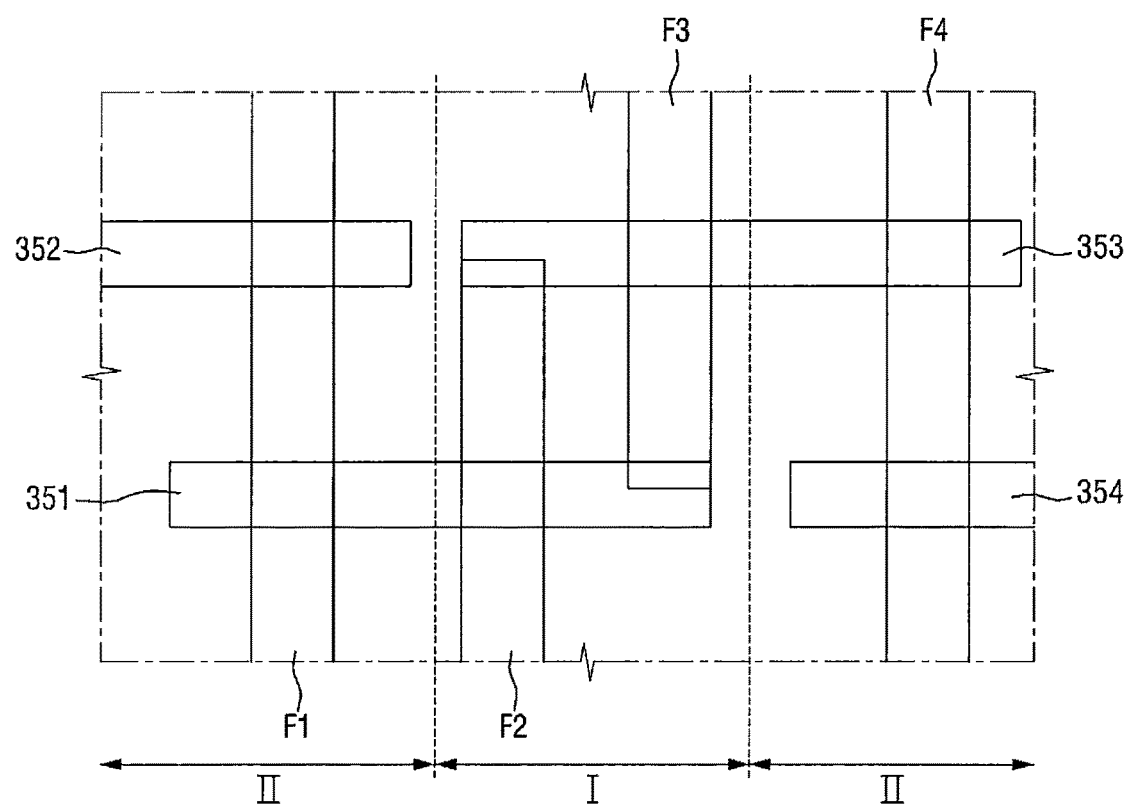

FIG. 13 illustrates only a plurality of fins and a plurality of gate structures from the layout view of FIG. 12. The semiconductor devices according to example embodiments of the present inventive concept can be applied to all devices including general logic devices using fin type transistors, but FIGS. 11 to 13 illustrate the semiconductor device according to the example embodiment of the present inventive concept with regard to a static random access memory (SRAM) by way of example.

First, referring to FIG. 11, the semiconductor device according to the example embodiments of the present inventive concept may include a pair of inverters INV1 and INV2 connected in parallel between a power supply node Vcc and a ground node Vss, and a first pass transistor PS1 and a second pass transistor PS2 connected to output nodes of the inverters INV1 and INV2.

The first pass transistor PS1 and the second pass transistor PS2 may be connected to a bit line BL and a complementary bit line /BL. Gates of the first pass transistor PS1 and the second pass transistor PS2 may be connected to a word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other.

The first pull-up transistor PU1 and the second pull-up transistor PU2 may be PMOS transistors, and the first pull-down transistor PD1 and the second pull-down transistor PD2 may be NMOS transistors.

In addition, in order to constitute a latch circuit, an input node of the first inverter INV1 is connected to an output node of the second inverter INV2 and an input node of the second inverter INV2 is connected to an output node of the first inverter INV1.

Referring to FIGS. 11 to 13, a first active fin F1, a second active fin F2, a third active fin F3, and a fourth active fin F4, which are spaced apart from one another, may extend lengthwise in one direction (e.g., in an up-and-down direction of FIG. 12).

In addition, a first gate structure 351, a second gate structure 352, a third gate structure 353, and a fourth gate structure 354 may extend lengthwise in the other direction (e.g., in a left-and-right direction of FIG. 12) so as to intersect the first to fourth active fins F1 to F4.

In detail, the first gate structure 351 completely intersects the first active fin F1 and the second active fin F2 while partially overlapping with a terminal of the third active fin F3. The third gate structure 353 completely intersects the fourth active fin F4 and the third active fin F3 while partially overlapping with a terminal of the second active fin F2. The second gate structure 352 and the fourth gate structure 354 are formed to intersect the first active fin F1 and the fourth active fin F4, respectively.

As shown in FIG. 12, the first pull-up transistor PU1 is defined in vicinity of an intersection of the first gate structure 351 and the second active fin F2, the first pull-down transistor PD1 is defined in vicinity of an intersection of the first gate structure 351 and the first active fin F1, and the first pass transistor PS1 is defined in vicinity of an intersection of the second gate structure 352 and the first active fin F1.

The second pull-up transistor PU2 is defined in vicinity of an intersection of the third gate structure 353 and the third active fin F3, the second pull-down transistor PD2 is defined in vicinity of an intersection of the third gate structure 353 and the fourth active fin F4, and the second pass transistor PS2 is defined in vicinity of an intersection of the fourth gate structure 354 and the fourth active fin F4.

Although not specifically shown, recesses are formed at opposite sides of intersections of the first to fourth gate structures 351-354 and the first to fourth active fins F1 to F4, source/drain regions may be formed in the recesses, and a plurality of contacts 361 may be formed.

Further, a shared contact 362 concurrently connects the second active fin F2, the third gate structure 353 and a wire 371. A shared contact 363 may also concurrently connect the third active fin F3, the first gate structure 351 and a wire 372.

The semiconductor devices according to some embodiments of the present inventive concept may be employed to the first pull-up transistor PU1, the first pull-down transistor PD1, the first pass transistor PS1, the second pull-up transistor PU2, the second pull-down transistor PD2, and the second pass transistor PS2.

Hereinafter, methods for fabricating a semiconductor device according to example embodiments of the present inventive concept will be described.

Figure 14:
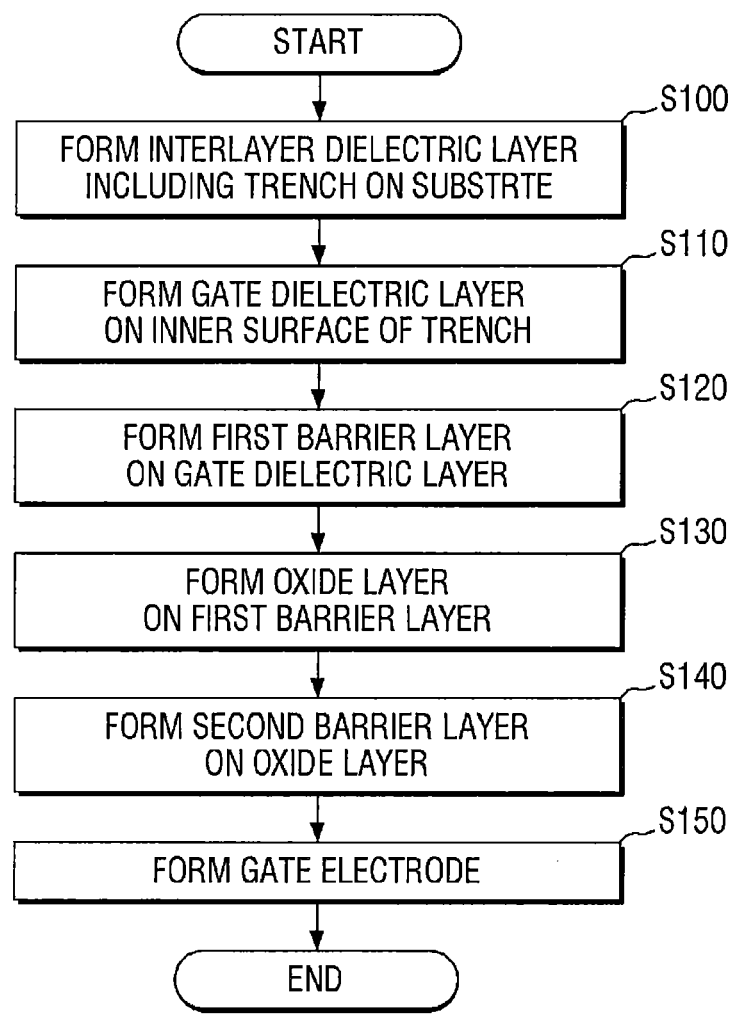
FIG. 14 is a flowchart schematically illustrating methods for fabricating a semiconductor device according to example embodiments of the present inventive concept.
Figure 15:
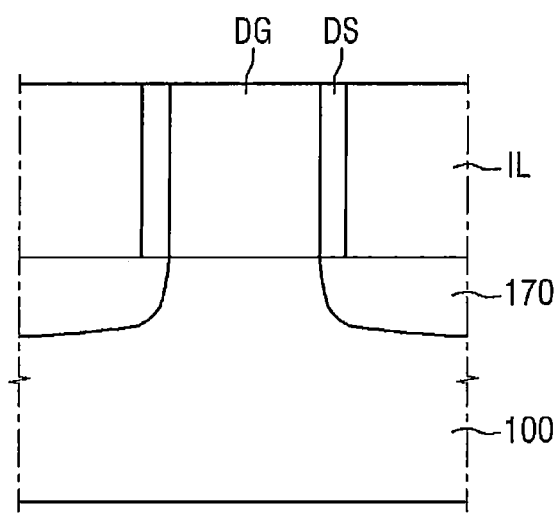
FIGS. 15 to 20 are views illustrating intermediate process operations in methods for fabricating a semiconductor device according to an embodiment of the present inventive concept.
Figure 16:
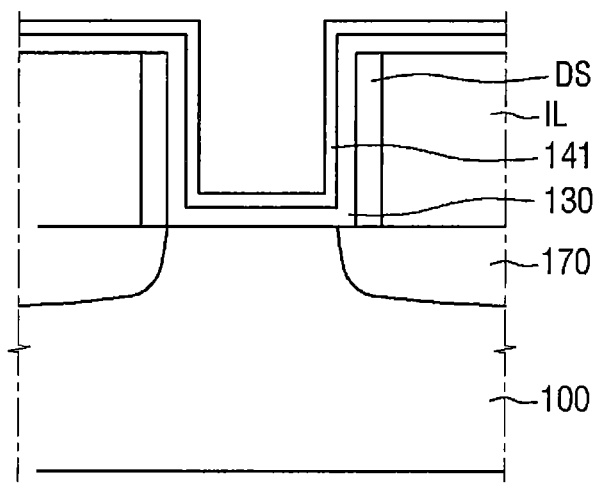
Figure 17:
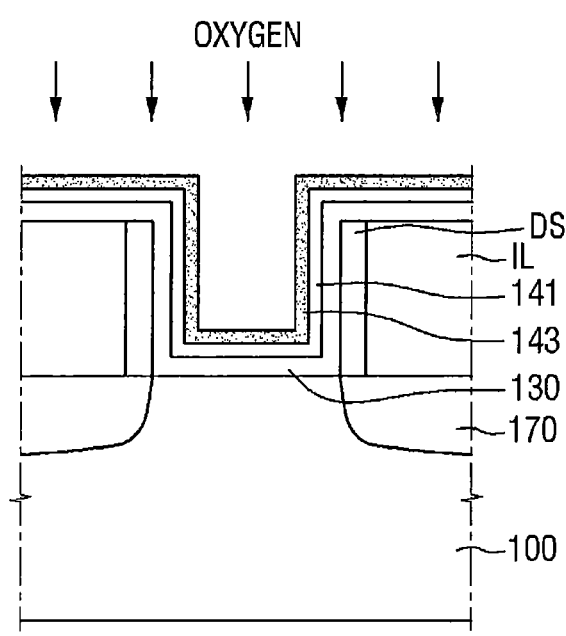
Figure 18:
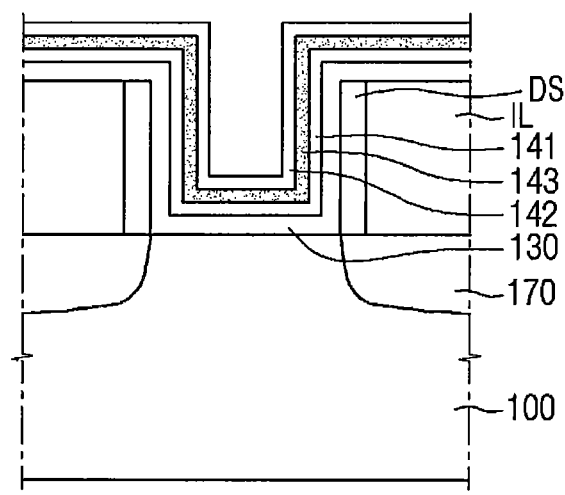
Figure 19:
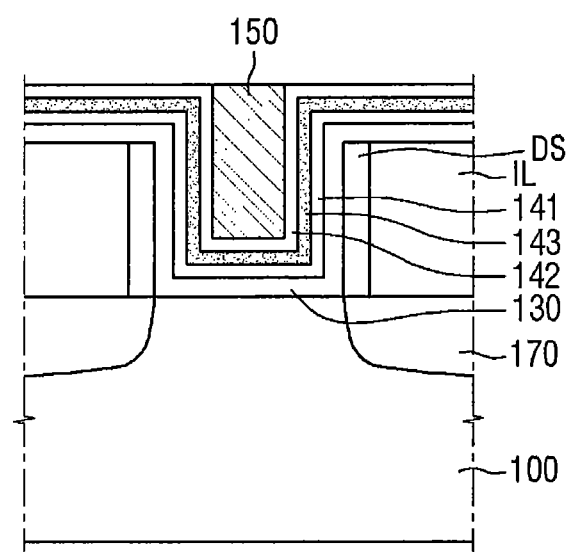

FIG. 14 is a flowchart schematically illustrating methods for fabricating a semiconductor device according to example embodiments of the present inventive concept and FIGS. 15 to 20 are views illustrating intermediate process operations in methods for fabricating a semiconductor device according to example embodiments of the present inventive concept.

Referring to FIGS. 14 to 20, the methods for fabricating a semiconductor device according to example embodiments of the present inventive concept include forming an interlayer dielectric layer pattern IL including a trench on a substrate 100 (block 1400).

In detail, after forming a dummy gate pattern DG, a dummy spacer pattern DS and the interlayer dielectric layer pattern IL on the substrate 100, the dummy gate pattern DG is removed to form the trench exposing the substrate 100. Before forming the interlayer dielectric layer pattern IL, a first source/drain region 170 may be formed in the substrate 100 using the dummy gate pattern DG and the dummy spacer pattern DS as masks.

Next, a first gate insulation layer 130 is formed on a inner surface of the trench (block 1410) and on the substrate 100. Next, a first barrier layer 141 is formed on the first gate insulation layer 130 (block 1420). The first barrier layer 141 may be conformally formed along sidewalls of the first gate insulation layer 130. The first barrier layer 141 may include a conductive material, for example, TiN. The first barrier layer 141 may be formed to have an appropriate thickness according to the kind of a device to be formed. For example, the first barrier layer 141 may be formed to have a thickness in a range of about 5 Å to about 25 Å.

Next, a first oxide layer 143 is formed on the first barrier layer 141 by exposing the first barrier layer 141 to an oxygen environment (block 1430). Here, the first oxide layer 143 may include an oxide (e.g., $TiO_2$) of a material (e.g., Ti) included in the first barrier layer 141 and may be formed to have a thickness of, for example, 20 Å or less. The first oxide layer 143 may be amorphous so as to function to block a physical diffusion path of the fluorine (F) ions.

Next, a second barrier layer 142 is formed on the first oxide layer 143 (block 1440). The second barrier layer 142 may include the same material as the first barrier layer 141. The second barrier layer 142 may include a conductive material, for example, TiN. The second barrier layer 142 may be formed to have an appropriate thickness according to the kind of a device to be formed. For example, the second barrier layer 142 may be formed to have a thickness in a range of about 5 Å to about 25 Å.

Next, a first gate electrode 150 is formed on the second barrier layer 142 (block 1450). The first gate electrode 150 may include a conductive material, for example, tungsten (W) and/or aluminum (Al).

Figure 20:
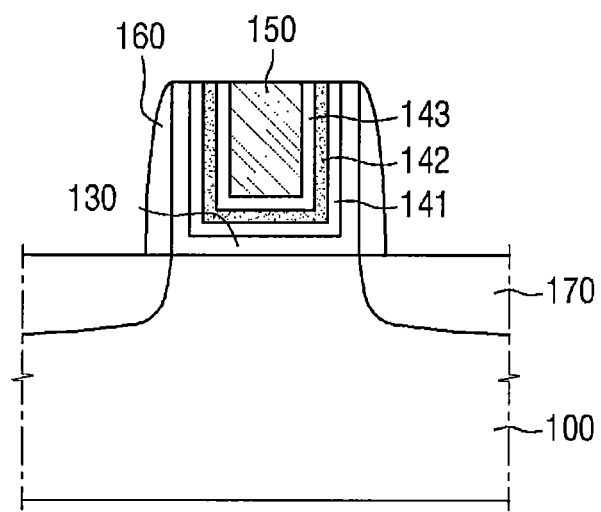

Next, planarizing and etching process steps are performed, thereby fabricating the semiconductor device shown in FIG. 20.

Figure 21:
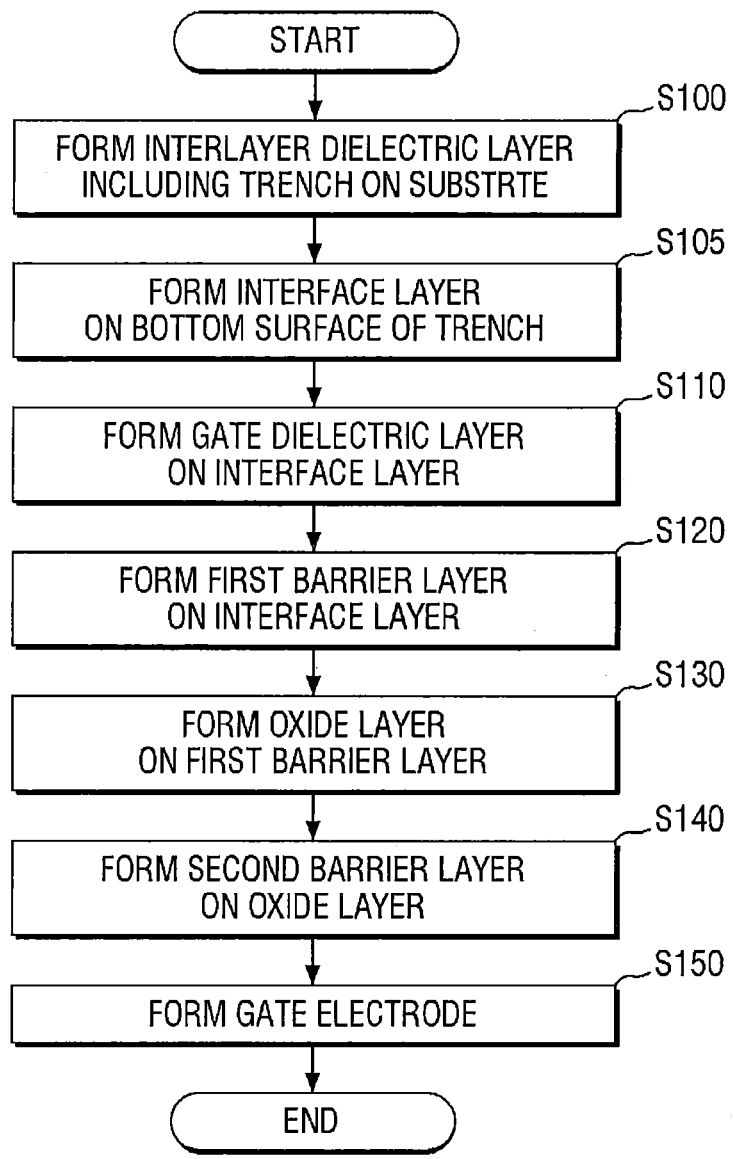
FIG. 21 is a flowchart schematically illustrating methods for fabricating a semiconductor device according to example embodiments of the present inventive concept.
Figure 22:
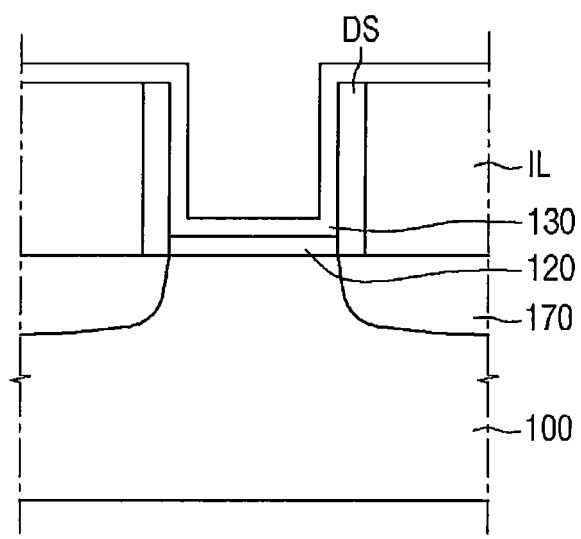
FIG. 22 is a view illustrating an intermediate process operation in methods for fabricating a semiconductor device according to example embodiments of the present inventive concept.

FIG. 21 is a flowchart schematically illustrating methods for fabricating a semiconductor device according to example embodiments of the present inventive concept and FIG. 22 is a view illustrating an intermediate process step in methods for fabricating a semiconductor device according to example embodiments of the present inventive concept. However, for the sake of brevity and convenient explanation, substantially the same elements and features as those of the methods for fabricating the semiconductor device according to the previous embodiments will be omitted.

Referring to FIGS. 21 and 22, before forming a first gate insulation layer 130, the methods for fabricating a semiconductor device according to some other embodiments of the present inventive concept may further include forming a first interface layer 120 (block 1405).

The first interface layer 120 may be formed on the substrate 100 and may be formed between the substrate 100 and the first gate insulation layer 130.

The first interface layer 120 may prevent interface failure between the substrate 100 and the first gate insulation layer 130. The first interface layer 120 may include a low-k dielectric having a dielectric constant (k) of 9 or less, for example, a silicon oxide layer (k=4) or a silicon oxynitride layer (k=4~8 according to the concentration of oxygen and nitrogen atoms). In some embodiments, the first interface layer 120 may include silicate or a combination of layers listed above.

Hereinafter, an electronic system including semiconductor devices according to some embodiments of the present inventive concept will be described with reference to FIG. 23.

Figure 23:
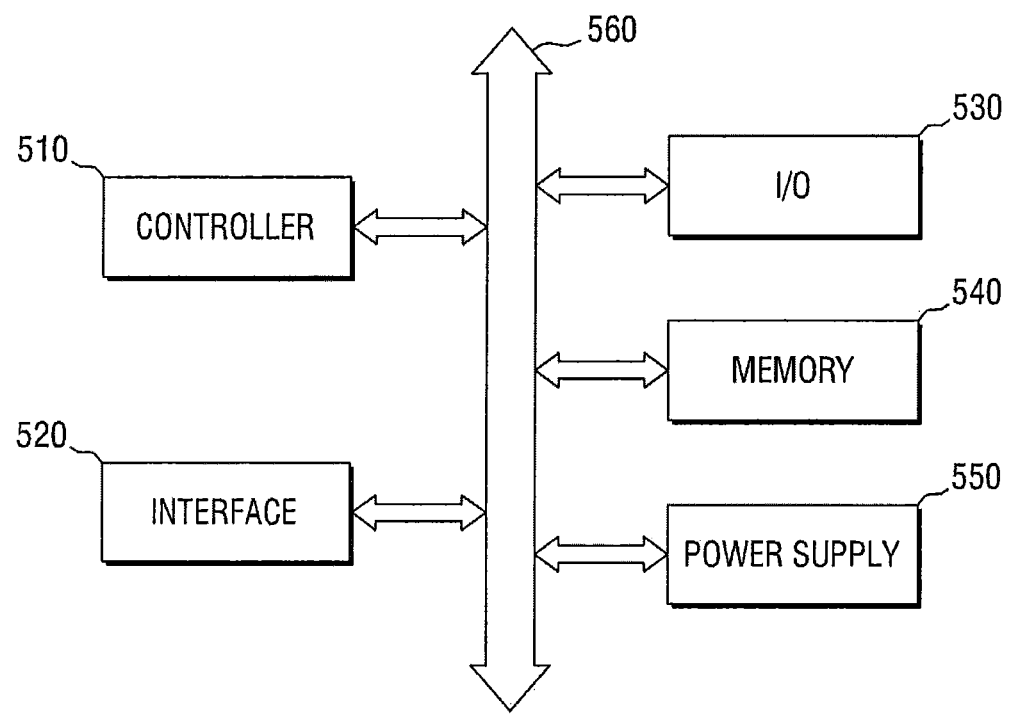
FIG. 23 is a schematic block diagram of an electronic system including semiconductor devices according to example embodiments of the present inventive concept.

FIG. 23 is a schematic block diagram of an electronic system including semiconductor devices according to some embodiments of the present inventive concept.

Referring to FIG. 23, the electronic system may include a controller 510, an interface 520, an input/output device (I/O) 530, a memory 540, a power supply 550, and a bus 560. The controller 510, the interface 520, the I/O 530, the memory 540, and the power supply 550 may be connected to each other through the bus 560. The bus 560 may correspond to a path through which data moves.

The controller 510 may include at least one of a microprocessor, a microcontroller, and/or logic elements capable of performing functions similar to those of such elements.

The interface 520 may perform functions of transmitting data to a communication network and/or receiving data from the communication network. The interface 520 may be wired or wireless. The interface 520 may include, for example, an antenna and/or a wired/wireless transceiver, and so on.

The I/O 530 may include a keypad, a display device, and so on, and may input/output data.

The memory 540 may store data and/or codes. The semiconductor devices according to some embodiments of the present inventive concept may be provided components of the memory 540.

The power supply 550 may convert externally input power and then may provide the converted power to various components 510 to 540.

Figure 24:
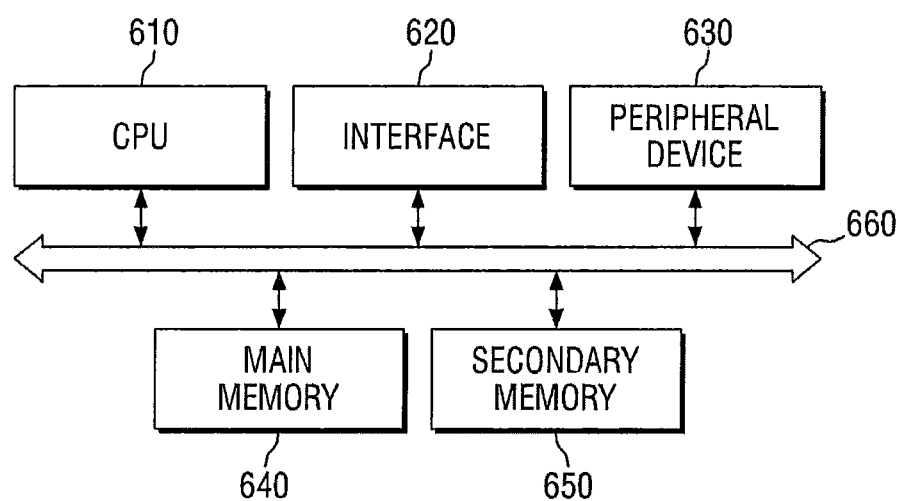
FIG. 24 is a schematic block diagram for explaining an application example of an electronic system including semiconductor devices according to example embodiments of the present inventive concept.

FIG. 24 is a schematic block diagram for explaining an application example of an electronic system including semiconductor devices according to some embodiments of the present inventive concept.

Referring to FIG. 24, the electronic system may include a central processing unit (CPU) 610, an interface 620, a peripheral device 630, a main memory 640, a secondary memory 650, and a bus 660.

The CPU 610, the interface 620, the peripheral device 630, the main memory 640, and the secondary memory 650 may be connected to each other through the bus 660. The bus 660 may correspond to a path through which data moves.

The CPU 610, which may include a controller, an arithmetic device, etc., may execute a program and may process data.

The interface 620 may transmit data to a communication network and/or may receive data from the communication network. The interface 620 may be configured in a wired/wireless manner. The interface 620 may include, for example, an antenna and/or a wired/wireless transceiver.

The peripheral device 630, including a mouse, a keyboard, a display device, a printer, etc., may input/output data.

The main memory 640 may transceive data to/from the CPU 610 and may store data and/or commands required to execute the program. The semiconductor devices according to some embodiments of the present inventive concept may be provided as some components of the main memory 640.

The secondary memory 650, including a nonvolatile memory, such as a floppy disk, a hard disk, a CD-ROM, and/or a DVD, may store the data and/or commands. The secondary memory 650 may store data even in an event of power interruption of the electronic system.

In addition, the semiconductor devices according to some embodiments of the present inventive concept may be implemented as a computer, an ultra mobile personal computer (UMPC), a work station, a net-book, a personal digital assistant (PDA), a portable computer, a web tablet, a wireless phone, a mobile phone; a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, a device capable of transmitting/receiving information in wireless environments, one of various electronic devices constituting a home network, one of various electronic devices constituting a computer network, one of various electronic devices constituting a telematics network, RFID devices, and/or embedded computing systems.

While the present inventive concept has been particularly shown and described with reference to example embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor device comprising:
   a gate insulation layer that is on a substrate;
   a first barrier layer that is on the gate insulation layer;
   an amorphous oxide layer that is on the first barrier layer, the amorphous oxide layer comprising an oxidized portion of a material included in the first barrier layer;
   a second barrier layer that is on the amorphous oxide layer, wherein the amorphous oxide layer is interposed between the first barrier layer and the second barrier layer;
   a gate electrode that is on the second barrier layer; and
   a source and a drain in the substrate and disposed at opposite sides of the gate electrode.

2. The semiconductor device of claim 1, wherein the first barrier layer includes a conductive material.

3. The semiconductor device of claim 2, wherein the first barrier layer and the second barrier layer include the same material.

4. The semiconductor device of claim 2, wherein the first barrier layer includes titanium (Ti).

5. The semiconductor device of claim 1, wherein the amorphous oxide layer has a thickness of about 20 Å or less.

6. The semiconductor device of claim 1, wherein the amorphous oxide layer includes TiO2.

7. The semiconductor device of claim 1, further comprising an interface layer that is between the substrate and the gate insulation layer.

8. A semiconductor device comprising:
   a substrate having a first region and a second region defined therein;
   a first transistor that is in the first region, the first transistor including a first gate insulation layer and a first barrier layer that is on the first gate insulation layer; and
   a second transistor that is in the second region, the second transistor including a second gate insulation layer, a second barrier layer that is on the second gate insulation layer, an amorphous oxide layer that is on the second barrier layer, a third barrier layer that is on the amorphous oxide layer, and a gate electrode that is on the third barrier layer, wherein the amorphous oxide layer is interposed between the second barrier layer and the third barrier layer,
   wherein the first transistor does not include the gate electrode,
   wherein the amorphous oxide layer includes an oxide comprising an oxidized portion of a material included in the second barrier layer, and
   wherein the first transistor has a first width and the second transistor has a second width that is different from the first width.

9. The semiconductor device of claim 8, wherein the second width is greater than the first width.

10. The semiconductor device of claim 8, wherein the first, second and third barrier layers include conductive materials.

11. The semiconductor device of claim 10, wherein the first, second and third barrier layers include the same material.

12. The semiconductor device of claim 8, wherein the amorphous oxide layer includes TiO2.

13. The semiconductor device of claim 8, further comprising:
    a first interface layer that is between the substrate and the first gate insulation layer; and
    a second interface layer that is between the substrate and the second gate insulation layer.

14. A semiconductor device comprising:
    a substrate including a first region and a second region defined therein;
    a first transistor that is on an active portion of the first region, the first transistor including a first gate insulation layer, a first barrier layer that is on the first gate insulation layer and a first gate spacer that is on lateral surfaces of the first gate insulation layer and the first barrier layer; and
    a second transistor that is on an active portion of the second region, the second transistor including a second gate insulation layer, a second barrier layer that is on the second gate insulation layer, an amorphous oxide layer that is on the second barrier layer, a third barrier layer that is on the amorphous oxide layer, a gate electrode that is on the third barrier layer and a second gate spacer that is on lateral surfaces of the second gate insulation layer and the second barrier layer,
    wherein the amorphous oxide layer is interposed between the second barrier layer and the third barrier layer,
    wherein the amorphous oxide layer comprises an oxidized portion of a material that is included in the second barrier layer, and
    wherein the first transistor has a first width and the second transistor has a second width different from the first width.

15. The semiconductor device of claim 14, wherein the first gate spacer and the second gate spacer comprise a same material.

16. The semiconductor device of claim 14, wherein the first transistor does not include the gate electrode.

17. The semiconductor device of claim 14, wherein the second width is greater than the first width.

18. The semiconductor device of claim 14, wherein the amorphous oxide layer includes TiO2.

19. The semiconductor device of claim 14, further comprising:
    a first interface layer that is between the substrate and the first gate insulation layer; and
    a second interface layer that is between the substrate and the second gate insulation layer.

* * * * *